(12) United States Patent
Lee et al.

(10) Patent No.: US 6,313,478 B1
(45) Date of Patent: Nov. 6, 2001

(54) SINGLE ELECTRON DEVICE USING ULTRA-THIN METAL FILM AND METHOD FOR FABRICATING THE SAME

(75) Inventors: Seongjae Lee; Kyoungwan Park; Mincheol Shin, all of Taejon (KR)

(73) Assignee: Electronics and Telecommunications Research Institute, Taejon (KR)

(*) Notice: Subject to any disclaimer, the term of this patent is extended or adjusted under 35 U.S.C. 154(b) by 0 days.

(21) Appl. No.: 09/475,221

(22) Filed: Dec. 30, 1999

(30) Foreign Application Priority Data

Nov. 25, 1999 (KR) .............................. 99-0052682

(51) Int. Cl.$^7$ .................................................. H01L 47/02
(52) U.S. Cl. .................. 257/8; 257/30; 326/35; 326/136
(58) Field of Search .................... 257/30, 37, 38, 257/39, 8, 288, 902, 347; 326/35, 136

(56) References Cited

U.S. PATENT DOCUMENTS

| | | | |
|---|---|---|---|
| 5,612,233 | 3/1997 | Roesner et al. | 437/40 |
| 5,646,559 | * 7/1997 | Higurashi | 326/136 |
| 5,665,979 | * 9/1997 | Takahashi et al. | 257/30 |
| 5,677,637 | * 10/1997 | Nakazato et al. | 326/35 |
| 5,710,051 | * 1/1998 | Park et al. | 437/7 |
| 5,731,598 | 3/1998 | Kado et al. | 257/30 |

FOREIGN PATENT DOCUMENTS

408306934-A * 11/1996 (JP) .

OTHER PUBLICATIONS

Nazarov; Coulomb Blockade Without Tunnel Junctions (Physical Review Letters; vol. 82); Feb. 8, 1999; pp. 1245–1248.

Likharev; Correlated Discrete Transfer of Single Electrons in Ultrasmall Tunnel Junctions (IBM J. Res. Develop. vol. 32 No. 1); Jan. 1988; pp. 144–158.

* cited by examiner

Primary Examiner—Nathan Flynn
Assistant Examiner—Remmon R. Fordë
(74) Attorney, Agent, or Firm—Jacobson Holman, PLLC

(57) ABSTRACT

There is provided a single electron device. The device has weak links with bottle-neck figure in place of the tunnel junction of the prior device. The weak links are easily formed on the same substrate by simple processes and thus the integration of the single electron device can be easily achieved.

15 Claims, 5 Drawing Sheets

SINGLE ELECTRON DEVICE USING ULTRA-THIN METAL FILM AND METHOD FOR FABRICATING THE SAME

FIELD OF THE INVENTION

The present invention relates to a single electron device; and, more particular, to a single electron transistor including weak links with bottleneck figure and etching damage, in the place of the conventional tunnel junctions of a single electron transistor, made from an ultra-thin metal film based on simple processes combined of lithography and etching processes. The single electron transistor is promising to embody integrated single electron circuits. The present invention also relates to a method for fabricating the same.

DESCRIPTION OF THE PRIOR ART

A single electron device is an ultimate scheme of electronic device in the purpose of controlling current with one electron. Concept about a single electron transistor similar to the conventional field effect transistor (FET) had already been proposed and there have been proceeded the researches about the devices in order to embody ultra large scale integrated memories or ultra low power digital circuits. There have also been proceeded the researches about the other various new functional devices or circuits using the same principle.

An example of the single electron device is a single electron transistor similar to the conventional FET, which will be described referring to FIG. 1 schematically depicting it.

A very small electron island 120 is coupled with two nodes 110 and 130 through two tunnel junctions 115 and 125, respectively, and coupled with an input node 140 through a capacitor 135. The tunnel junctions between the electron island and the respective two nodes 110 and 130 are characterized by the resistances and capacitances of $(R_1, C_1)$ and $(R_2, C_2)$, respectively. A constant voltage, $V_o$, is biased at the node 110, and a control voltage $V_g$ is input at the node 140 of the capacitor 135 to control the characteristics of the electron island.

Such a structure is very similar to the conventional MOSFET. The two nodes 110 and 130 correspond to the source and drain respectively, and the input node 140 also corresponds to the gate.

FIG. 2 is a graph showing the characteristics of the single electron transistor as described above. The drawing shows the relation of the control voltage $V_g$ and the current I through the electron island via the tunnel junctions when a voltage $V_o$ is biased.

When the constant voltage $V_o$ is input at the node 110 and the voltage $V_g$ is input at the input node, namely gate 140, the current I is a dependent function of the voltage $V_g$ with peak patterns having a period of $e/C_g$. Here, the peak corresponding to MAX is a conducting state released of the Coulomb blockade, and the part of MIN is an insulating state derived from the Coulomb blockade. The drawing shows that the current is a period function of the voltage $V_g$ with a period of $e/C_g$ and that the charge amount induced by the capacitor 135 can be detected with the sensitivity as little as an elementary charge e. This means that the source-drain current is modified by the induced charge amount of an elementary charge. Accordingly, this is called as a single electron transistor.

The characteristics of the tunnel junctions are given with the resistors and capacitances of $(R_1, C_1)$ and $(R_2, C_2)$.

Assumed that the capacitance of the capacitor 135 is given as $C_g$, the conditions in which the phenomena shown in FIG. 2, namely, single electron tunnel phenomena occurs, are as follows.

$$R_i >> h/e^2 \approx 26\ K\Omega (i=1,2) \tag{1}$$

$$e^2/C_t >> k_B T, C_t = C_1 + C_2 + C_g \tag{2}$$

Here, h is $6.63 \times 10^{-34}$ J sec as Plank constant, e is $1.60 \times 10^{-19}$ C as charge amount of electron, $k_B$ is $1.38 \times 10^{-23}$ J/K as Boltsmann constant, and T is Kelvin temperature with a unit of K.

The mathematical formula (1) is a required condition of single electron tunneling to discern each event of tunneling each electron from another event. The formula (2) is a condition that the electron entered into the island blocks another electron with thermal fluctuations from entering into the island against Coulomb energy. These requirements mean that the impedance of the single electron device itself should be several hundred k$\Omega$as known in the formula (1), and that in order to operate the device at room temperature, the size of the island should be less than several decade nanometers and, as a result, the total capacitance $C_t$ of the island 120 should be an order of aF ($10^{-18}$ Farad), as known in the formula (2).

As described above, the essential features of the single electron device are the size of the island 120 and the good characteristic tunnel junctions 115 and 125. Here, the good characteristic tunnel junctions mean that the tunnel junctions should have the resistance $R_i$ and capacitance $C_i$ according to the formulae (1) and (2). At the present time, the fabrication methods of the single electron devices to satisfy these conditions are classified as two groups in terms of the used material: metals and semiconductors.

In the case of the metal material, Al or Nb is mainly used with double angle evaporation technique. At first, patterns are formed with a size less than several decade nm by electron beam lithography and metal is deposited to form the electron island and other electrodes ambient to the island. After that, the metal film is natural-oxidized to form a good oxide film on the surface. Subsequently, another layer of metal film is again deposited with slightly different angle to form the tunnel junction. This method is advantageous to fabricate a unit component. However, it is impossible to apply the method to the integration of single electron elements for practicing the single electron device, because of the complication of processes including three-stage levels and the limitation of double angle evaporation technique.

In the case of semiconductor, gates are fabricated on channel, using electron beam lithography (oxidation and etching in case of silicon) and the tunnel junction is inducible by the gate voltage. However, this also requires such several levels of fabrication processes that it has many difficulties in the integration of single electron elements.

As described above, the prior single electron device integration requires very difficult conditions in its fabrication. That is, it requires patterning technique of 10-nm level for operation at room temperature and tunnel junctions having a capacitance of about several aF and a resistance of about several decade k$\Omega$. With the present technique, the fabrication of separate components can be proceeded to apply it to analog device such as sensor and detector, current standards and the like. However, the fabrication of the integrated digital circuit, which is more utilized and larger in demand, can not be proceeded with the prior material and processes.

In order to obtain the digital signal treatment of the single electron device and the utility as memory device, the integration of the single electron elements is essential. Thus, to achieve such requirements, it is very important to develop the fabrication processes of the single electron device to be easy and simple.

SUMMARY OF THE INVENTION

It is, therefore, an object of the present invention to provide a single electron device able to solve the above-described problems of the prior arts. The device has weak links with bottleneck figure in place of the tunnel junction of the prior device. The weak links are easily formed on the same substrate by simple processes and thus the integration of the single electron device can be easily achieved.

In accordance with an aspect of the present invention, there is provided a single electron device comprising: an insulating substrate; an ultra-thin metal film on the substrate; and a protecting insulating film on the metal film to protect the metal film, wherein the metal film comprises: a source region; an electron island coupled with the source region; a drain region coupled with the electron island; two weak links with bottleneck figure, through which the source and drain regions are coupled with the electron island, respectively, each of the weak links being inducible of the Coulomb blockade effect; and a gate electrode for providing a control voltage to control electric characteristics of the electron island.

In the single electron device of the present invention, the gate electrode may be capacitively coupled with the electron island laterally. In that case, the gate electrode and the electron island may be formed from the same metal film by etching it. However, the gate electrode may be formed on the insulating film capacitively to be coupled with the electron island vertically. The former is considered to be more preferable.

Otherwise, the gate electrode may be resistively coupled with the electron island. In that case, the gate electrode may be coupled with the electron island by means of a weak link, which is inducible of the single electron phenomena such as Coulomb blockade and Coulomb oscillations.

The weak links used in place of the tunnel junctions as well as for coupling the gate electrode with the island in case of the resistively coupled gate may be formed together with the source, the drain, the island and the gate electrode from the metal film by etching. At this time, the etching damage in the almost entire parts of weak links and the outmost parts of the other metal regions increases the resistance of the parts to at least 100 times. The increased resistance in the weak links can play a role of the tunnel junctions.

In accordance with another aspect of the present invention, there is provided a method for fabricating a single electron device, comprising the steps of: providing an insulating substrate; forming an ultra-thin metal film on the substrate; forming a protecting insulating film on the metal film to protect the metal film; and selectively etching the protecting insulating film and the metal film, in turn, to form a pattern of the metal film, wherein the pattern of the metal film includes a source region, an electron island, a drain region, two weak regions with bottleneck figure and a gate electrode, wherein the source and drain regions are coupled with the electron island through the two weak links, respectively, each of the weak links is inducible of the Coulomb blockade effect, and the gate electrode is for providing a control voltage to control electric characteristics of the electron island.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiments with reference to the accompanying drawings.

The present invention relates to a technique apt practically to accomplish the integration of the single electron device by easy and simple processes using an ultra-thin metal film. The single electron device may include a single electron transistor, a single electron memory, and the like.

Now, there will be, in detail, described a single electron transistor as an example of the single electron device and a method for fabricating the same, hereinafter.

The single electron transistors according to the present invention may be integrated on a substrate by using one lithography and etching, forming an electron island and weak links coupling the island with respective source and drain regions without separate align lithography or gate forming process.

Figure 1:
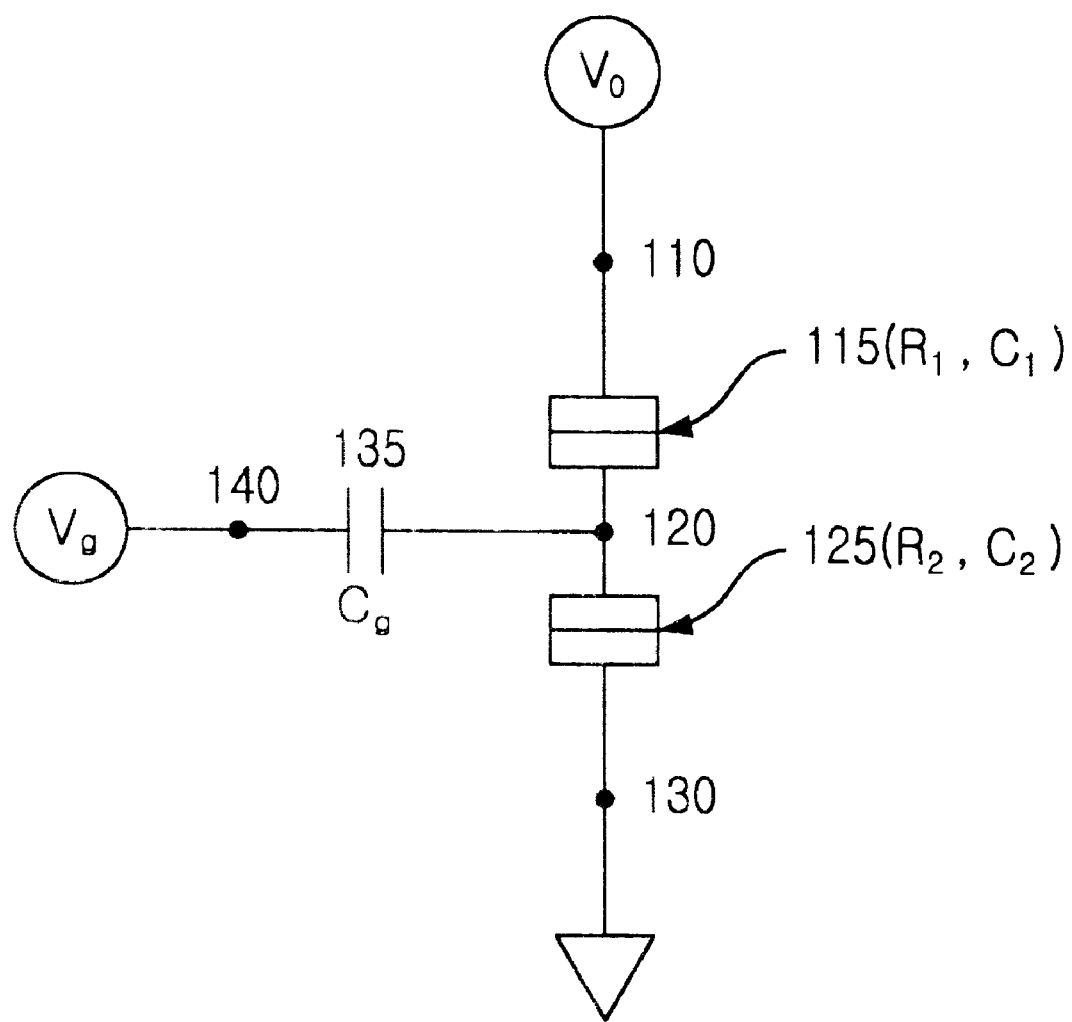
FIG. 1 is a schematic diagram of general single electron transistor.
Figure 2:
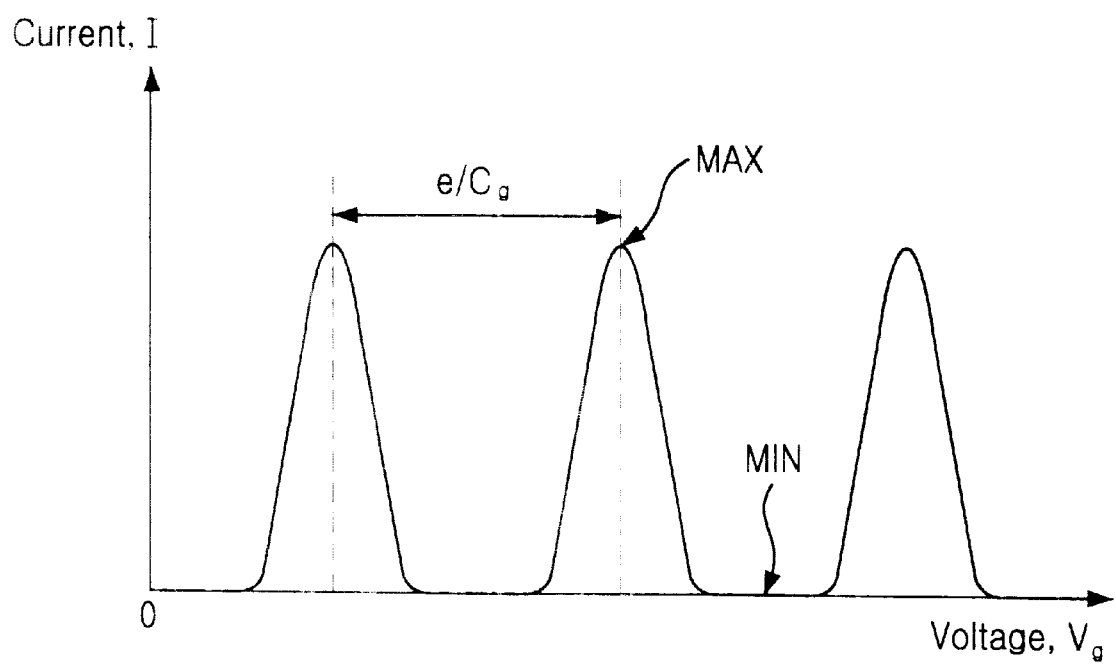
FIG. 2 is a graph showing the I–$V_g$ characteristics of the single electron transistor according of FIG. 1.
Figure 3:
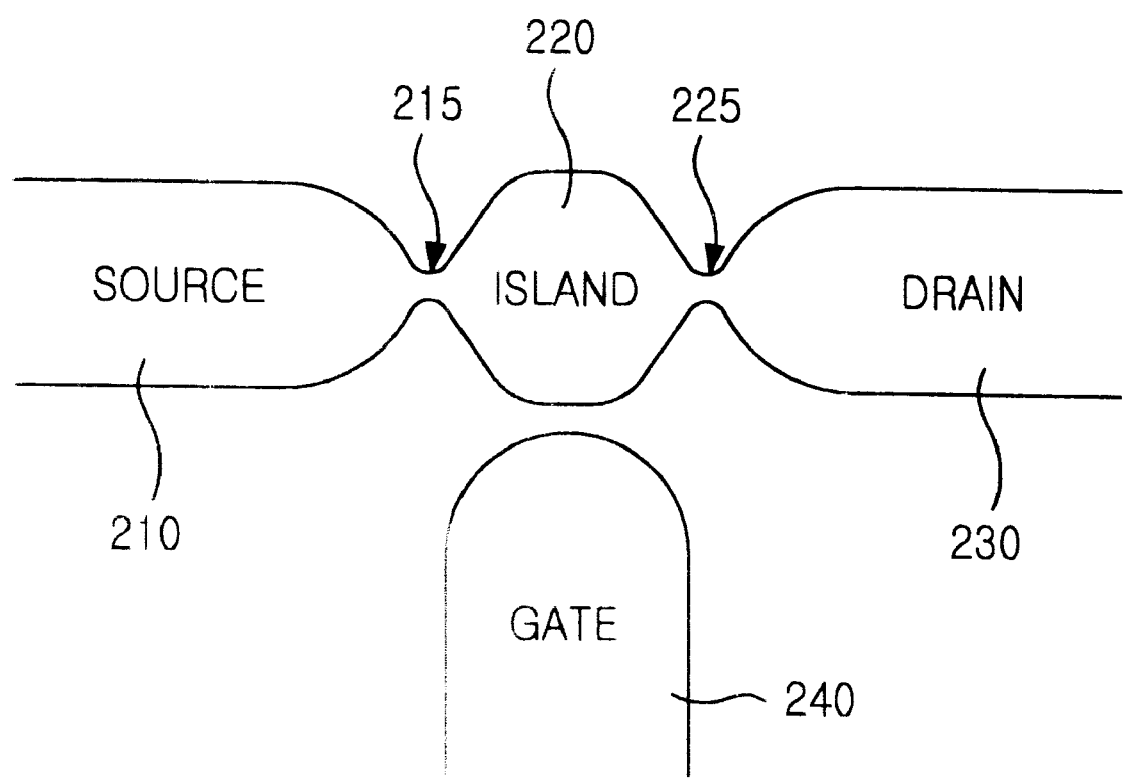
FIG. 3 is a schematic diagram of capacitively-coupled single electron transistor of one embodiment according to the present invention.

FIG. 3 shows a schematic structure of capacitively-coupled single electron transistor (C-SET) according to one embodiment of the present invention. In comparison with FIG. 1, an electron island 220 is coupled with a source electrode 210 and a drain electrode 230 through weak links with bottleneck figure in place of the tunnel junctions applied to the prior single electron transistor. There have been already confirmed in several researches (for example, in Yuli V. Nazarov, Phys. Rev. Lett. 82(6), pp. 1245–1248, (1999)), that the weak link used in the present invention in place of the tunnel junction of the prior single electron transistor is inducible of the single electron phenomena such as the Coulomb blockade and the Coulomb oscillations. However, the weak link has not yet been accomplished practically and also, the means to obtain the weak link have not yet been known.

Figure 5:
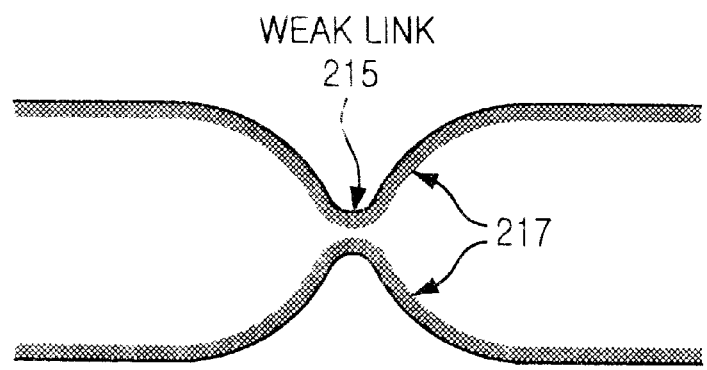
FIG. 5 is an enlarged plane view of the weak link with bottleneck figure of FIG. 3.

The weak links 215 and 225 is narrower than the other regions. Further, as shown in FIG. 5, etching results in the damage at the parts covered from the etching boundary surface to a certain distance in the weak links, substantially, at the almost whole parts of weak links. As a result, the diffusive scatterer for electron is generated at the damaged parts of the weak links, which is higher in its resistance than the undamaged parts of the other regions. Thus, electrons are confined within the electron island 220. Accordingly, the weak links play a role of the tunnel junction.

Figure 4:
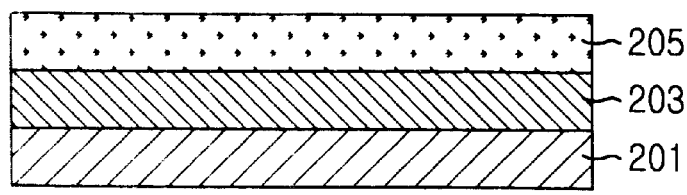
FIG. 4 is a cross-sectional view showing the structure including the ultra-thin metal film of FIG. 3.

FIG. 4 shows a cross-sectional view of the structure of the single electron transistor of FIG. 3 with the etching-damaged weak links having bottleneck figure. As shown in the drawing, the single electron transistor includes an insulating substrate, the ultra-thin film, and the protective insulating layer with the pattern including the weak links in FIG. 3.

In the present invention, the ultra-thin metal film is defined as a continuous metal film with a thickness less than 3 nm, in other words, with a thickness less than five layers of metal atom. Such metal material may include transition metals (preferably, the transition metals of IIIb, IVb, Vb and VIb families in the periodic table, for example, Ti and Mo), alloys thereof (for example, Ti—Ni), and compounds containing transition metal (for example, Mo—C, Mo—Ge, Mo—Si, Ti—C). The metal material is deposited on an appropriate substrate with suitable conditions to form a continuous ultra-thin film. The sheet resistance of the metal film amounts to from several to several decade k$\Omega$. Further, the resistances of the weak links 215 and 225 become to several M$\Omega$ by the etching damage. Thus, the weak links can play a role of the tunnel junction.

Now, the method for fabricating the single electron transistor will be described with the reference of FIG. 4, in detail. An ultra-thin film 203 is formed on an insulating substrate 201 with a thickness of several atomic layers. For example, the metal film is formed as a film of Mo—C under atmosphere of acetylene and Ar gases by reactive-sputtering method using Mo target. A protective insulating film 205 is then formed on the metal film. For example, it is formed as a film of Si—C under the same atmosphere by reactive-sputtering method using Si target. The material of the insulating substrate may include Si, $SiO_2$, $Al_2O_3$, MgO and the like. The material of the protecting insulating film 205 may include SiC, $SiO_2$, $Al_2O_3$ and the like. The protective insulating film 205 plays a role of protecting the metal film from being oxidized. The deposition method for the metal film 203 and the protective insulating film 205 may include thermal evaporation, sputter deposition, chemical vapor deposition (CVD), and molecular beam epitaxy (MBE).

After the deposition of the protective insulating film, a resist film for lithography is formed on the protective insulating film and patterned to obtain the pattern of FIG. 3. For example, PMMA solution is spin-coated with 7000 rpm to form the resist film with 70-nm thickness. The protective insulating film and the metal film are then etched, in turn and the resist is removed. At this time, the etching method may include both of dry and wet etching methods. However, it is preferable to use dry etching method to ensure the formation of the damaged weak link 215 as shown in FIG. 5. The width of the bottlenecked part of weak links can be determined with the etching damage width. The formed weak links may be preferably 5 to 20 nm in width and 10 to 50 nm in length. Then, the parts that the metal film is removed will be filled with an insulating film and subsequent processes including wiring process will be performed.

In the single electron transistor fabricated by such processes, the weak links with bottleneck figure have very high resistance caused from etching damage and thus can play a role of the tunnel junction. Therefore, the weak links give the single electron effect such as the Coulomb blockade and the Coulomb oscillations for the electrons to enter into the electron island. As a result, the transistor fabricated by the present invention can be operated as a single electron transistor.

Figure 6:
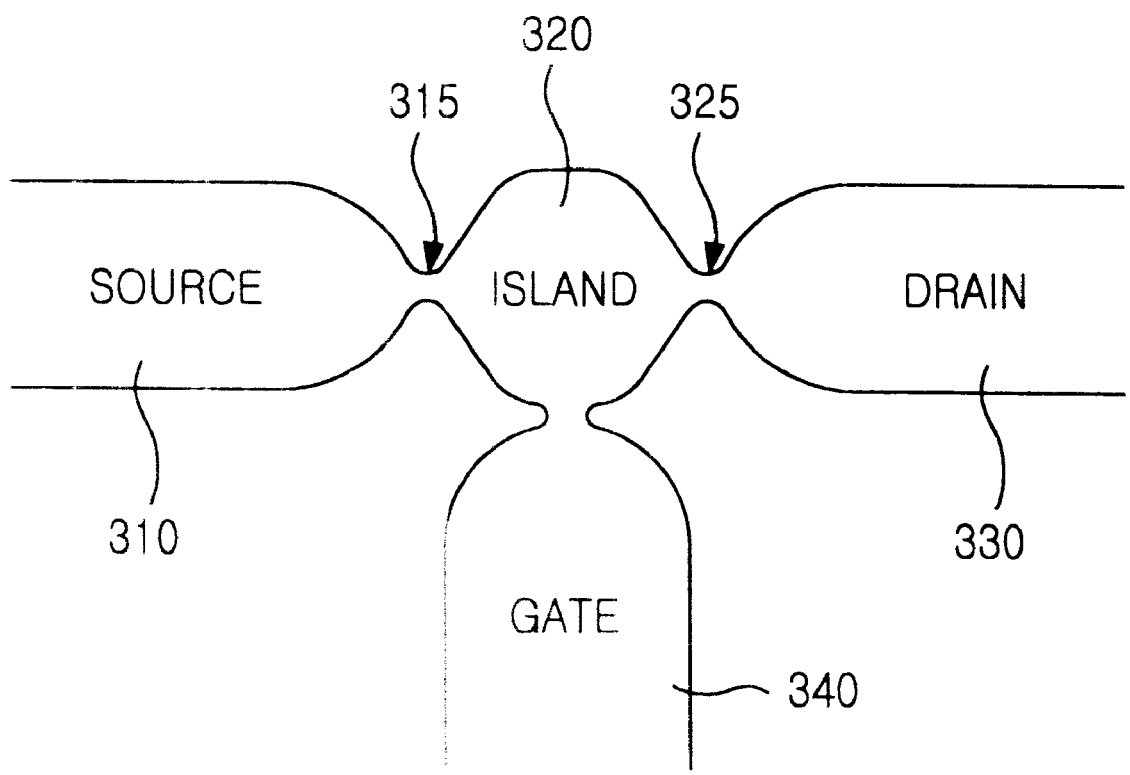
FIG. 6 is a schematic diagram of resistively-coupled single electron transistor of another embodiment according to the present invention.

FIG. 6 shows the structure of resistively-coupled single electron transistor (R-SET) according to another embodiment of the present invention.

The R-SET of FIG. 6 is different from the capacitively-coupled single electron transistor (C-SET) in that a weak link is used in place of the capacitor between the gate electrode and the island. Since this structure can be easily fabricated by the processes described above, the detail description is not given.

In comparison with the C-SET, the advantages of R-SET according to this embodiment are that the voltage gain is generally higher and the non-uniformity or fluctuation of the transistor characteristics by background charge can be eliminated.

While the present invention has been described with respect to certain preferred embodiments only, other modifications and variations may be made without departing from the spirit and scope of the present invention as set forth in the following claims.

What is claimed is:

1. A single electron device comprising:
   an insulating substrate;
   a ultra-thin metal film on the substrate; and
   a protecting insulating film on the metal film to protect the metal film,
   wherein the metal film comprises:
      a source region;
      an electron island coupled with the source region;
      a drain region coupled with the electron island region;
      two weak links with bottleneck figure, through which the source and drain regions are coupled with the electron island, respectively, each of the weak links being inducible of the Coulomb blockade effect.

2. The single electron device according to claim 1, wherein single or multiple gate electrodes are coupled with the electron island for providing a control voltage to control electric characteristics of the said device.

3. The single electron device according to claim 2, wherein the gate electrode is capacitively coupled with the electron island in such a way that the said gate electrode and the electron island are formed from etching the same metal film and the space between them is filled with an insulating material.

4. The single electron device according to claim 2, wherein the gate electrode is capacitively coupled with the electron island in such a way that the said gate electrode is deposited on the surface of the electron island with insulating material therebetween.

5. The single electron device according to claim 2, wherein the gate electrode is resistively coupled with the electron island.

6. The single electron device according to claim 5, wherein the gate electrode is coupled with the electron island through a weak link being inducible of the Coulomb blockade effect.

7. The single electron device according to claim 6, wherein the weak link is formed together with the gate electrode and the electron island from the metal film by etching and the damage by etching increases the resistance of the weak link's region to be higher at least 100 times than that of the other regions in the metal film.

8. The single electron device according to claim 1, wherein the substrate is formed with Si, $SiO_2$, $Al_2O_3$ or MgO.

9. The single electron device according to claim 1, wherein the metal film is formed with at least one selected from the group consisting of transition metals of IIIb, IVb, Vb and VIb families in the periodic table, alloys thereof and compounds containing the transition metal, the transition metal being able to form the single atomic layers of the metal film continuously on the substrate.

10. The single electron device according to claim 1, wherein the protecting insulating film is formed with SiC, $SiO_2$, or $Al_2O_3$.

11. The single electron device according to claim 1, wherein the metal film is etched with etching damage, by which the electron island region surrounded by the weak links is changed to the state to exhibit the Coulomb blockade effect.

12. The single electron device according to claim 11, wherein the etching damage increases the resistance of the weak links' region to be higher at least 100 times than that of the other regions in the metal film.

13. The single electron device according to claim 11, wherein the etching damage is formed by dry etching.

14. The single electron device according to claim 1, wherein the thickness of the metal film is 3 nm or less.

15. The single electron device according to claim 1, wherein the weak links are 5 to 20 nm in width and 10 to 50 nm in length.

* * * * *